US012567814B2

(12) United States Patent
Pieler et al.

(10) Patent No.: US 12,567,814 B2
(45) Date of Patent: Mar. 3, 2026

(54) METHOD AND DEVICE FOR CALIBRATING A TIME BASE SIGNAL IN A PHOTOVOLTAIC INVERTER

(71) Applicant: FRONIUS INTERNATIONAL GMBH, Pettenbach (AT)

(72) Inventors: Roland Pieler, Pettenbach (AT); Harald Kreuzer, Pettenbach (AT); Christian Angerer, Pettenbach (AT)

(73) Assignee: Fronius International GmbH, Pettenbach (AT)

( * ) Notice: Subject to any disclaimer, the term of this patent is extended or adjusted under 35 U.S.C. 154(b) by 220 days.

(21) Appl. No.: 18/293,102

(22) PCT Filed: Aug. 4, 2022

(86) PCT No.: PCT/EP2022/071989
§ 371 (c)(1),
(2) Date: Jan. 29, 2024

(87) PCT Pub. No.: WO2023/012291
PCT Pub. Date: Feb. 9, 2023

(65) Prior Publication Data
US 2024/0283348 A1     Aug. 22, 2024

(30) Foreign Application Priority Data
Aug. 5, 2021    (EP) ..................................... 21189920

(51) Int. Cl.
*H02M 7/537*          (2006.01)
*G01R 35/00*          (2006.01)
(Continued)

(52) U.S. Cl.
CPC .......... *H02M 7/537* (2013.01); *G01R 35/005* (2013.01); *G04F 1/005* (2013.01); *G04R 40/00* (2013.01); *G06F 1/04* (2013.01)

(58) Field of Classification Search
CPC ........... G04R 40/00; G04F 1/005; G06F 1/04; G01R 35/005; H02M 7/537
See application file for complete search history.

(56) References Cited

U.S. PATENT DOCUMENTS 9,648,414 B1 *  5/2017  Das ........................ H03G 3/348
2010/0254225 A1  10/2010  Schweitzer, III et al.
(Continued)

OTHER PUBLICATIONS

International Search Report corresponding to PCT Application No. PCT/EP2022/071989, mailed Nov. 16, 2022 (English language document) (4 pages).

*Primary Examiner* — Harry R Behm
(74) *Attorney, Agent, or Firm* — Maginot, Moore & Beck

(57)          ABSTRACT

A method and device is provided for calibrating a time base signal in a photovoltaic inverter, which has a conversion circuit configured to convert a DC current into an AC current. The method comprises the steps of: receiving a reference signal by a receiving unit from an external reference signal source; determining a deviation between the received reference signal and a time base signal which is generated by a local time signal generator; correcting the generated time base signal to minimize the determined deviation or calculating a correction factor, wherein the calibration unit automatically corrects the time base signal obtained from the time signal generator, even when a reference signal is temporarily unavailable, depending on at least one operating parameter which is stored in a data memory and which is formed by an internal temperature inside the housing of the photovoltaic inverter and/or by a measured supply voltage; and adapting predetermined values for components of the conversion circuit depending on the corrected time base signal or depending on the calculated correction factor.

13 Claims, 5 Drawing Sheets

(51) Int. Cl.
   G04F 1/00        (2006.01)
   G04R 40/00        (2013.01)
   G06F 1/04        (2006.01)

(56)                    References Cited

U.S. PATENT DOCUMENTS

2012/0109259  A1*    5/2012  Bond ..................... A61N 1/025
                                                    607/60
2016/0072513  A1*    3/2016  Dickerson ................. H03L 7/26
                                                    331/16
2020/0363832  A1*   11/2020  Sotiropoulos ......... H04J 3/0688

* cited by examiner

Figures 5A, 5B, 5C, 5D:
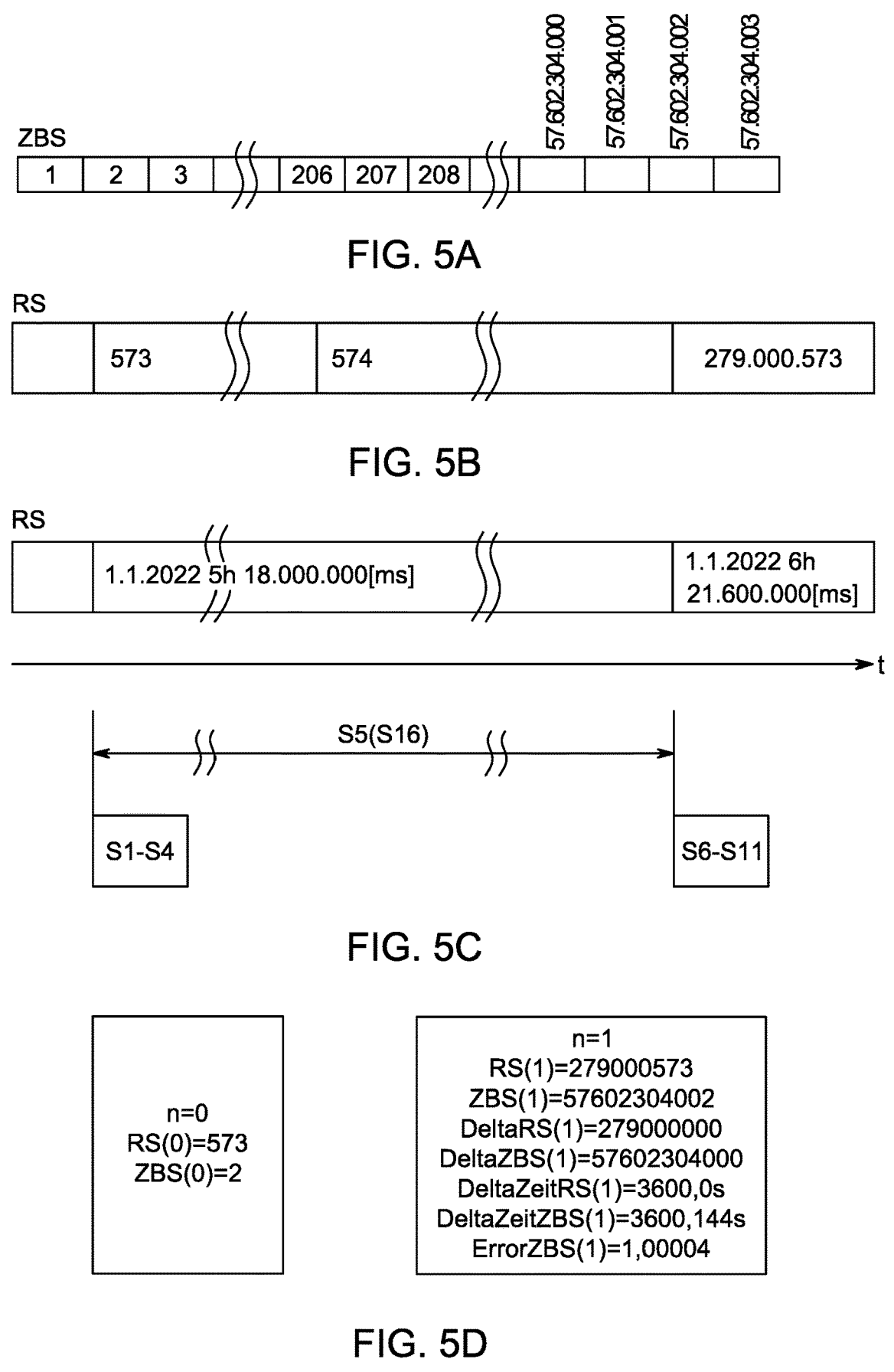

ZBS

| 1 | 2 | 3 | ~ | 206 | 207 | 208 | ~ | 57.602304.000 | 57.602304.001 | 57.602304.002 | 57.602304.003 |

| | 573 | ~ | 574 | ~ | 279.000.573 |

| | 1.1.2022 5h 18.000.000[ms] | ~ | | ~ | 1.1.2022 6h 21.600.000[ms] | t →

S5(S16)

S1-S4

S6-S11

FIG. 5C n=0
RS(0)=573
ZBS(0)=2 n=1
RS(1)=279000573
ZBS(1)=57602304002
DeltaRS(1)=279000000
DeltaZBS(1)=57602304000
DeltaZeitRS(1)=3600,0s
DeltaZeitZBS(1)=3600,144s
ErrorZBS(1)=1,00004

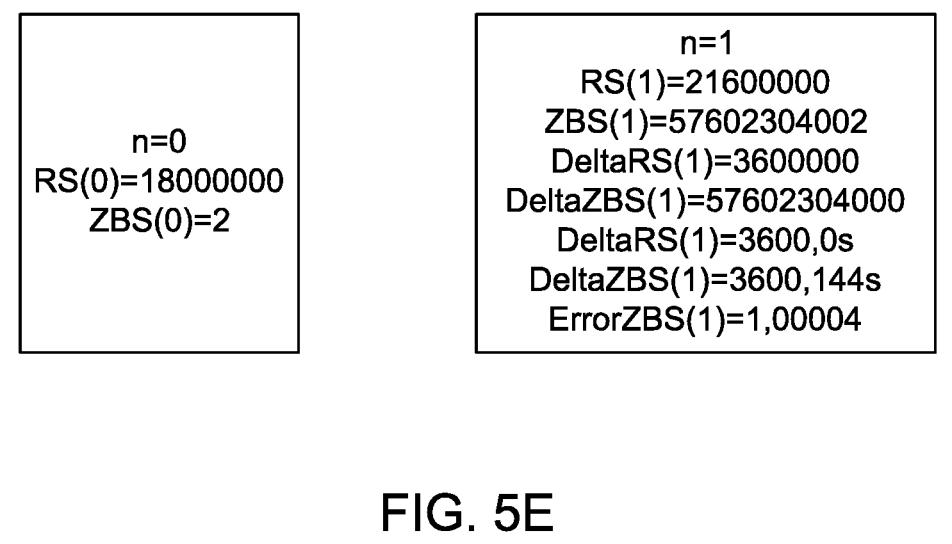

FIG. 5D n=0
RS(0)=18000000
ZBS(0)=2 n=1
RS(1)=21600000
ZBS(1)=57602304002
DeltaRS(1)=3600000
DeltaZBS(1)=57602304000
DeltaRS(1)=3600,0s
DeltaZBS(1)=3600,144s
ErrorZBS(1)=1,00004

FIG. 5E

METHOD AND DEVICE FOR CALIBRATING A TIME BASE SIGNAL IN A PHOTOVOLTAIC INVERTER

PRIORITY CLAIM

This application is a U.S. national stage of PCT/EP2022/071989, filed on Aug. 4, 2022, which claims priority to European Application No. 21189920.8, filed on Aug. 5, 2021. The disclosure of both applications is specifically incorporated herein by reference.

FIELD OF THE INVENTION

The invention relates to a method and apparatus for calibrating a time base signal in a photovoltaic inverter or solar inverter that converts a direct current, DC, to an alternating current, AC.

BACKGROUND OF THE INVENTION

A photovoltaic inverter converts a locally generated direct current into one or more alternating currents, which can be fed into a power supply grid. The inverter forms part of a photovoltaic system. Solar modules or photovoltaic modules of the photovoltaic system generate, under sunlight, a direct current, which is converted into an alternating current by an electronic circuit of the photovoltaic inverter. The photovoltaic inverter has a conversion circuit, which is usually designed with three stages. The conversion circuit comprises a DC/DC converter or direct voltage/direct voltage converter on the input side, which is connected to a DC/AC conversion stage via an intermediate circuit. The DC-DC converter can have a so-called maximum power point tracker. One can distinguish different types of solar inverters, in particular module inverters, string inverters, multi-string inverters, central inverters, and hybrid inverters.

Photovoltaic inverters are usually installed in a photovoltaic system over a long period of time and in many cases are operated for years. Conventionally, photovoltaic inverters are tested for reliable operation and accuracy by the manufacturer at or before delivery to a customer. However, the electronic components installed within the photovoltaic inverter are subject to an aging process. For the generation of control signals as well as for taking measurements, in particular measurements of the grid frequency of the power supply grid, conventional photovoltaic inverters comprise time signal sources or time signal generators. The time signal generator generates a time base signal, on the basis of which control signals are derived for controlling electronic components and for performing measurements. Due to the aging of the timing components within the photovoltaic inverter, the measurement or frequency measurement accuracy, i.e. the frequency accuracy of the time base signal, also suffers during operation of the photovoltaic inverter. In conventional photovoltaic inverters, grid frequencies are determined with a resolution in the millihertz range. The time signal generators integrated into the photovoltaic inverters usually have tolerances of this order of magnitude right from the start, i.e. at the time of delivery. This can lead to a measuring unit of the photovoltaic inverter measuring the grid frequency of the power supply grid only inaccurately and switching off the feed-in of the alternating current either too early or too late. A too early disconnection of the AC current by the inverter is a disadvantage for the operator of the photovoltaic system, because it leads to a reduction of the fed AC current. Conversely, a delayed switch-off of the photovoltaic inverter means that it cannot make its due contribution to the grid stability of the power supply grid.

SUMMARY OF THE INVENTION

It is therefore an object of the present invention to provide a method and an apparatus which takes into account and compensates for the above disadvantages due to the aging of timing components within the inverter.

This task is solved, according to the invention, by a method with the features indicated in patent claim 1. Accordingly, the invention provides a method for calibrating a time base signal in a photovoltaic inverter which has a conversion circuit with components for converting a direct current into an alternating current, comprising the following steps:

receiving a reference signal by a receiving unit of the photovoltaic inverter from an external reference signal source;

determining a deviation between the received reference signal and a time base signal generated by a local time signal generator of the photovoltaic inverter, wherein the time base signal is formed by a clock signal;

correcting the time base signal to minimize the deviation or calculating a correction factor, wherein the time base signal generated by the time signal generator is automatically corrected based on the reference signal in case the reference signal is available, and wherein the time base signal generated by the time signal generator is automatically corrected, in case the reference signal is temporarily unavailable, in dependence on at least one stored operating parameter, which is formed by a measured internal temperature prevailing inside the housing of the photovoltaic inverter and/or by a measured supply voltage; and adjusting nominal values for at least one component of the conversion circuit depending on the corrected time base signal or depending on the calculated correction factor.

In a possible embodiment of the method according to the invention, the time base signal is automatically corrected continuously or at regular time intervals to minimize the determined deviation.

In a possible embodiment of the method according to the invention, the determined deviations between the reference signal received by the receiving unit and the time base signal generated by the time signal generator and/or the calculated correction factor are stored together with at least one operating parameter of the photovoltaic inverter in a data storage of a calibration unit of the photovoltaic inverter.

The invention further provides, according to another aspect, a photovoltaic inverter with the features disclosed in claim 5.

Accordingly, the invention provides a photovoltaic inverter comprising:

a conversion circuit comprising electronic components which convert a received direct current into an alternating current;

a time signal generator which generates a time base signal, the time base signal being formed by a clock signal;

a receiving unit which is provided for receiving a reference signal from an external reference signal source;

a calibration unit which receives the time base signal from the time signal generator and automatically corrects the time base signal on the basis of the reference signal received by the receiving unit or calculates a correction factor, wherein the time base signal generated by the time signal generator is automatically corrected based on the reference signal in case the reference signal is available, and wherein the time base signal generated by the time signal generator is automatically corrected, in case the reference signal is temporarily unavailable, depending on at least one stored operating parameter which is formed by a measured internal temperature prevailing inside the housing of the photovoltaic inverter and/or by a measured supply voltage; and with a control unit which adjusts one or more nominal values for a regulating unit of the conversion circuit of the photovoltaic inverter in dependence on the corrected time base signal or the calculated correction factor.

In a possible embodiment of the photovoltaic inverter according to the invention, the calibration unit of the photovoltaic inverter determines a deviation between the reference signal received by the receiving unit and the time base signal obtained from the time signal generator, and automatically corrects the obtained time base signal to minimize the determined deviation continuously or at regular time intervals.

In a possible embodiment of the photovoltaic inverter according to the invention, the deviations determined by the calibration unit between the reference signal received by the receiving unit and the time base signal obtained by the time signal generator, or the correction factor calculated by the calibration unit are stored in a data storage of the photovoltaic inverter connected to the calibration unit.

In a possible embodiment of the photovoltaic inverter according to the invention, the determined deviations between the reference signal received by the receiving unit and the time base signal obtained by the time signal generator and/or the calculated correction factor are stored together with at least one operating parameter of the photovoltaic inverter in the data storage of the calibration unit, wherein the operating parameter is formed by an internal temperature inside the housing of the photovoltaic inverter, $T_{innen}$, which is measured by a temperature sensor of the photovoltaic inverter, and/or by a measured supply voltage.

In one possible embodiment of the photovoltaic inverter according to the invention, the conversion circuit receives the direct current from a photovoltaic array and feeds the converted alternating current into a power supply grid via a controllable grid disconnection device.

In a possible embodiment of the photovoltaic inverter according to the invention, a measuring unit of the photovoltaic inverter determines a current grid frequency of a power supply grid based on the time base signal corrected by the calibration unit.

In a possible embodiment of the photovoltaic inverter according to the invention, the time signal generator comprises a quartz, resonator, or oscillator, that generates an oscillating time base signal and transmits it to the calibration unit of the photovoltaic inverter.

In possible embodiments of the photovoltaic inverter according to the invention, the receiving unit of the photovoltaic inverter comprises a radio signal receiver that receives a radio reference signal from a radio signal source, or the receiving unit of the photovoltaic inverter comprises a GPS receiver that receives a GPS reference signal from a GPS signal source, or the receiving unit of the photovoltaic inverter receives a reference signal from a server via a data network.

In a possible embodiment of the photovoltaic inverter according to the invention, nominal values of electric currents or of electric power for driving at least one electronic component or stage of the conversion circuit are continuously adjusted by the control unit of the photovoltaic inverter on the basis of the time base signal corrected by the calibration unit or on the basis of the correction factor calculated by the calibration unit.

The invention further provides a photovoltaic system comprising a photovoltaic array for generating a direct current, which is converted, by a photovoltaic inverter according to the second aspect of the invention, into an alternating current for a power supply grid and/or for local electricity consumers.

The nominal values or set point values provided by the control unit to the regulating unit are preferably power nominal values.

In one possible embodiment, the grid frequency comprises the frequency of a power supply grid that can be connected to the photovoltaic inverter. Its grid frequency can be measured with a measuring unit. The measuring unit receives the time base signal corrected by the calibration unit and/or the calculated correction factor and can thus determine the grid frequency of the power supply grid more accurately or more precisely.

The control unit can also control other electronic components of the photovoltaic inverter based on the time base signal corrected by the calibration unit and/or initiate measurements based on the time base signal corrected by the calibration unit by at least one measurement unit of the photovoltaic inverter.

In the photovoltaic inverter according to the invention, the local time base signal is corrected or calibrated so that the accuracy of the preset or setpoint values, control signals and/or measurement signals derived from it is increased. This increases the reliability of the photovoltaic inverter during operation. Furthermore, aging processes of timing components within the inverter are continuously compensated during operation. This can significantly increase the operating life of the photovoltaic inverter. Furthermore, an optimized feed-in of converted AC voltage or converted AC current into the power supply grid can be achieved. This can increase the grid stability, in particular the stability of the grid frequency of the power supply grid.

The photovoltaic inverter can also feed several current phases L into the power supply grid, for example into a three-phase power supply grid, whereby the regulation of the electrical active and/or reactive power fed by the photovoltaic inverter into a respective current phase L of the power supply grid can be carried out separately for each current phase L1, L2, L3 with the aid of the nominal or set point values output by the control unit.

The photovoltaic inverter feeds alternating current into the power supply grid at a specific frequency. This frequency always corresponds to the currently measured grid voltage frequency. This is ensured, for example, by controlling the phase angle and works even with an incorrect time base. In the photovoltaic inverter according to the invention, the provision of the calibration unit prevents the resulting measurement of the grid frequency by the measuring unit from providing an inaccurate or false result.

Stabilization of the grid frequency f of the power supply grid is achieved indirectly by continuous regulation of the current fed into the power supply grid by the photovoltaic inverter or of the electrical power P fed into it, in particular the active power fed into it, by means of continuously adjusted nominal values or set point values.

In a possible embodiment of the photovoltaic inverter according to the invention, the deviations determined by the calibration unit between the reference signal received by the receiving unit and the time base signal obtained from the time signal generator are stored in a data storage of the calibration unit.

In another possible embodiment of the photovoltaic inverter according to the invention, the determined deviations between the reference signal received by the receiving unit and the time base signal obtained from the time signal generator are stored in the data storage of the calibration unit together with at least one further operating parameter of the photovoltaic inverter.

In another possible embodiment of the photovoltaic inverter according to the invention, the operating parameter has an internal temperature prevailing inside the housing of the photovoltaic inverter, which is measured by a temperature sensor of the photovoltaic inverter.

In another possible embodiment of the photovoltaic inverter according to the invention, the operating parameter has a measured supply voltage.

In another possible embodiment of the photovoltaic inverter according to the invention, the calibration unit of the photovoltaic inverter corrects the time base signal obtained from the time signal generator additionally depending on at least one further operating parameter stored in the data storage of the calibration unit, even if the reference signal is temporarily unavailable.

In another possible embodiment of the photovoltaic inverter according to the invention, the conversion circuit receives the direct current from a photovoltaic array and feeds the converted alternating current into a power supply grid via a controllable grid disconnection device.

The grid disconnection device provides galvanic insulation of the photovoltaic inverter from the power supply grid when opened. For example, in the event of inadmissible states of the grid (under/over voltage, under/over frequency) an automatic disconnection of the photovoltaic inverter from the power supply grid occurs.

In another possible embodiment of the photovoltaic inverter according to the invention, a measuring unit of the photovoltaic inverter determines a current grid frequency of the power supply grid based on the time base signal corrected by the calibration unit.

In another possible embodiment of the photovoltaic inverter according to the invention, control signals for driving the electronic components of the conversion circuit are generated by the control unit of the photovoltaic inverter on the basis of the time base signal corrected by the calibration unit.

BRIEF DESCRIPTION OF THE DRAWINGS

In the following, possible embodiments of the photovoltaic inverter according to the invention as well as of the calibration method according to the invention are explained in more detail with reference to the attached figures.

FIG. 5A-5E an explanation of the operation of a process according to the invention.

DETAILED DESCRIPTION OF EMBODIMENTS

Figure 1:
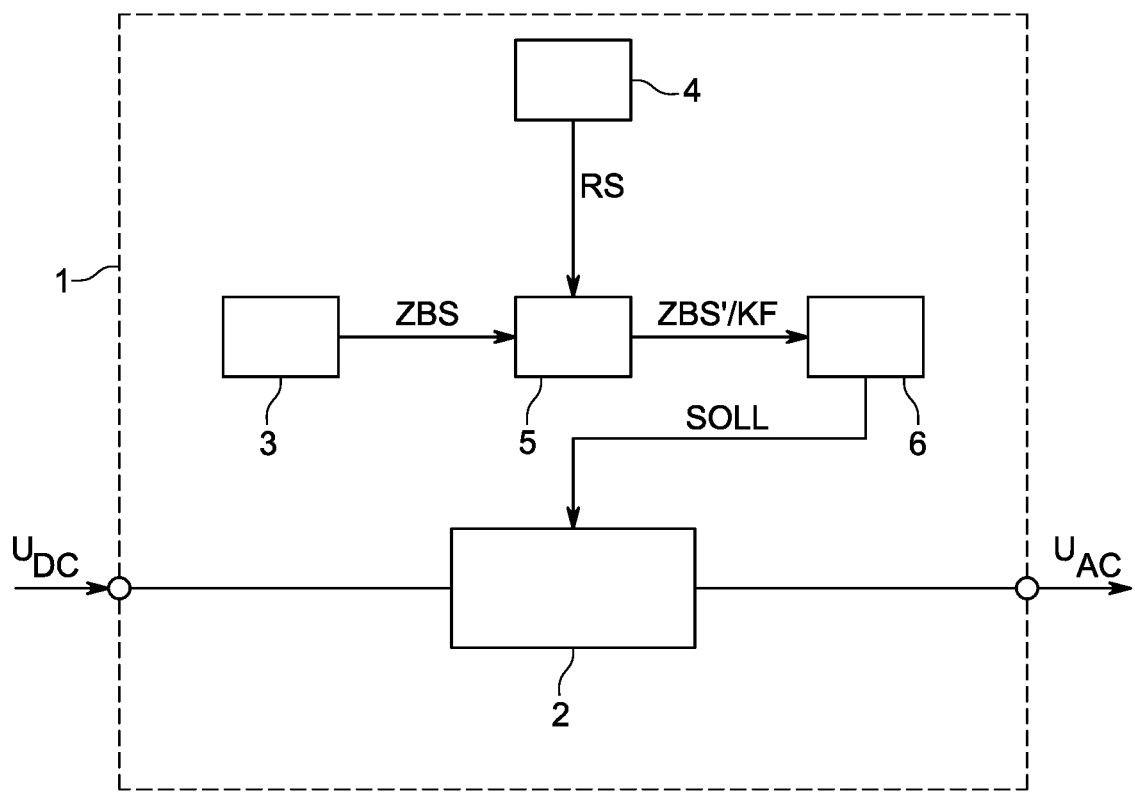
FIG. 1 a block diagram explaining a possible embodiment of a photovoltaic inverter according to the invention.

FIG. 1 depicts an embodiment of a photovoltaic inverter 1 according to the invention. As can be seen from the block diagram shown, the photovoltaic inverter 1 has a conversion circuit 2 which converts a received direct current into an alternating current. For this purpose, the conversion circuit 2 includes various stages, as also shown in FIG. 2. The conversion circuit 2 includes electronic components to convert the received direct current into the alternating current. In addition to the conversion circuit 2, the photovoltaic inverter 1 includes at least one local time signal generator 3 that generates a time base signal ZBS. Furthermore, the photovoltaic inverter 1 comprises a receiving unit 4 provided for receiving a reference signal from an external reference signal source RSQ. The receiving unit 4 outputs the received reference signal RS to a calibration unit 5 of the photovoltaic inverter 1, as shown in the block diagram according to FIG. 1. The calibration unit 5 corrects the time base signal ZBS received from the time signal generator 3 based on the reference signal received from the receiving unit 4. In this way, the calibration unit 5 generates a corrected time base signal ZBS' as shown in FIG. 1 and passes this corrected time base signal ZBS' to a control unit 6 of the photovoltaic inverter 1. Preferably, the functional components shown, i.e. the time signal generator 3, the receiving unit 4, and the calibration unit 5 are part of the control unit 6, which performs these functions with the existing hardware.

Alternatively, the calibration unit 5 can also calculate and provide a correction factor KF. The control unit 6 provides nominal values or set point values (set points) which are transmitted from the control unit 6 to a regulating unit 2D of the conversion circuit 2, as shown in FIG. 2. The regulating unit 2D generates control signals or control signals CRTL which are applied to the various stages and/or electronic components of the conversion circuit 2. The regulating unit 2D generates control signals CRTL which are applied, in particular, by the regulating unit 2D to a DC/DC converter stage 2A and/or to a DC/AC converter stage 2C of the conversion circuit 2. The PWM frequency is not corrected. Nominal values or set point values for powers P or currents I are corrected depending on the corrected time base signal ZBS' or depending on the calculated correction factor KF. The correction of the time base signal ZBS results in a more accurate measurement and thus a more accurate preset value of the electric current I or the electric power P. The electronic components, in particular power components, of the conversion circuit 2 are controlled by the regulating unit 2D according to the nominal values or set point values, which are continuously adjusted by the control unit 6 on the basis of the time base signal ZBS' corrected by the calibration unit 5 or the correction factor KF calculated by the calibration unit 5. Furthermore, measurements based on the time base signal ZBS' corrected by the calibration unit 5 are caused by at least one measuring unit of the photovoltaic inverter 1.

The calibration unit 5 of the photovoltaic inverter 1 determines a deviation between the reference signal RS received by the receiving unit 4 and the time base signal ZBS obtained from the time signal generator 3. The calibration unit 5 corrects the obtained time base signal ZBS to minimize the determined deviations. In one possible embodiment, this correction can take place continuously automatically. Alternatively, the minimizing of the determined deviations by the calibration unit 5 occur at regular predefined intervals.

In a possible embodiment, the photovoltaic inverter 1 comprises at least one receiving unit 4. In a possible embodiment, the receiving unit 4 of the photovoltaic inverter 1 has a radio signal receiver that receives a radio reference signal from an external radio signal source. These radio reference signals comprise, for example, time radio signals (e.g. DCF 77), which are received via the existing photovoltaic modules as receivers and/or are received by means of a receiving antenna—formed, for example, by an existing measuring sensor system—of the receiving unit 4. In an alternative embodiment, the receiving unit 4 of the photovoltaic inverter 1 may also comprise an additional GPS receiver that receives a GPS reference signal from a GPS signal source. Furthermore, in another possible embodiment, the receiving unit 4 may also be connected to one or more servers via a data network. In this embodiment, the receiving unit 4 receives a reference signal RS from a server that generates the reference signal via the data network—for example, an existing WLAN module or via an existing Ethernet interface. In a possible embodiment, a current time can be queried directly from a time server via an Internet access of the photovoltaic inverter 1, and a reference signal RS can be derived therefrom. One or more receiving units 4 can be provided redundantly.

Figure 2A:
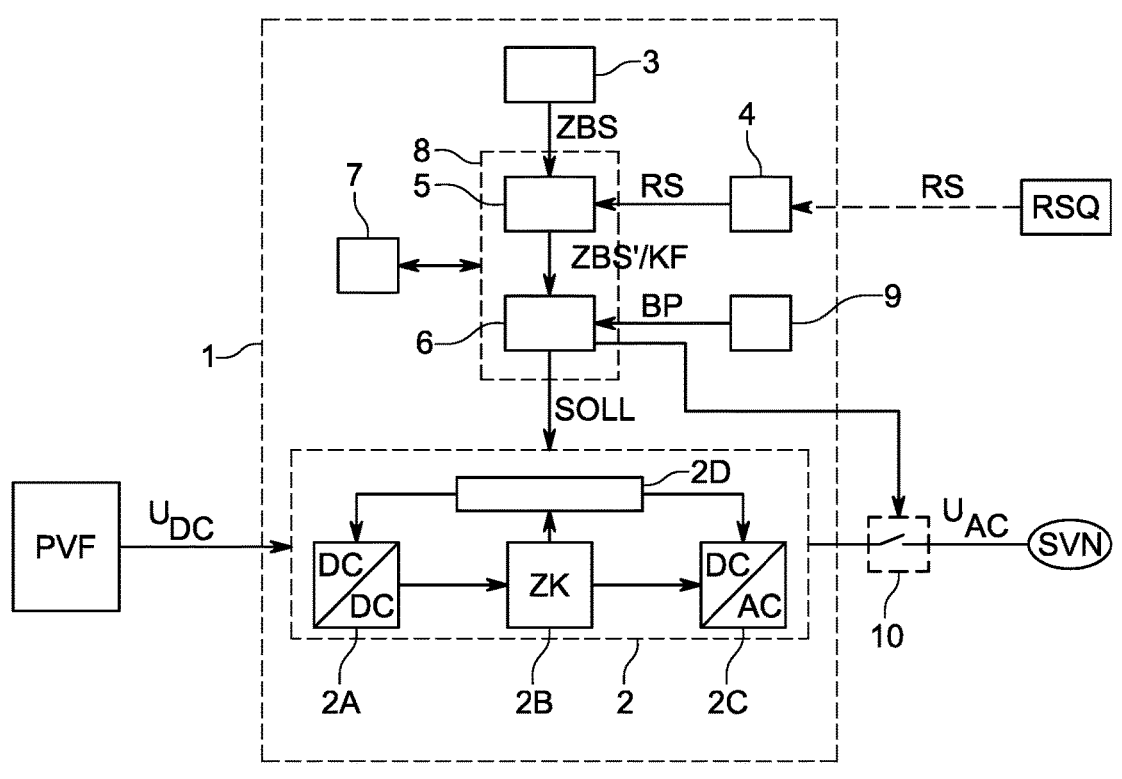
FIGS. 2A, 2B further block diagrams explaining the operation of a photovoltaic inverter according to the invention within a photovoltaic system.

FIG. 2A shows a photovoltaic system comprising a photovoltaic inverter 1 according to the invention. The photovoltaic system includes a photovoltaic array PVF with one or more photovoltaic modules PVM, which generates a direct current when exposed to sunlight. The photovoltaic modules array may include one or more photovoltaic strings of serially connected solar, or photovoltaic, modules PVM. The generated DC current is applied to a conversion circuit 2 of the photovoltaic inverter 1. In the illustrated embodiment, the conversion circuit 2 comprises three stages, namely a DC-DC converter stage 2A, an intermediate circuit 2B, and a DC-AC converter 2C. The various stages 2A, 2B, 2C are controlled by control signals or regulating signals CRTL, which are generated by the regulating unit 2D according to the nominal values or set point values (SOLL) of the photovoltaic inverter 1 provided by the control unit 6. In the embodiment shown in FIG. 2A, the deviations between the reference signal RS received from the receiving unit 4 and the time base signal ZBS received from the time signal generator 3, which are determined by the calibration unit 5, can be written to or stored in a data storage 7. This data storage 7 may also be integrated in the calibration unit 5. Furthermore, the calibration unit 5 and the control unit 6 may be integrated in a computing unit 8 of the photovoltaic inverter 1, as indicated in FIG. 2A.

Figure 2B:
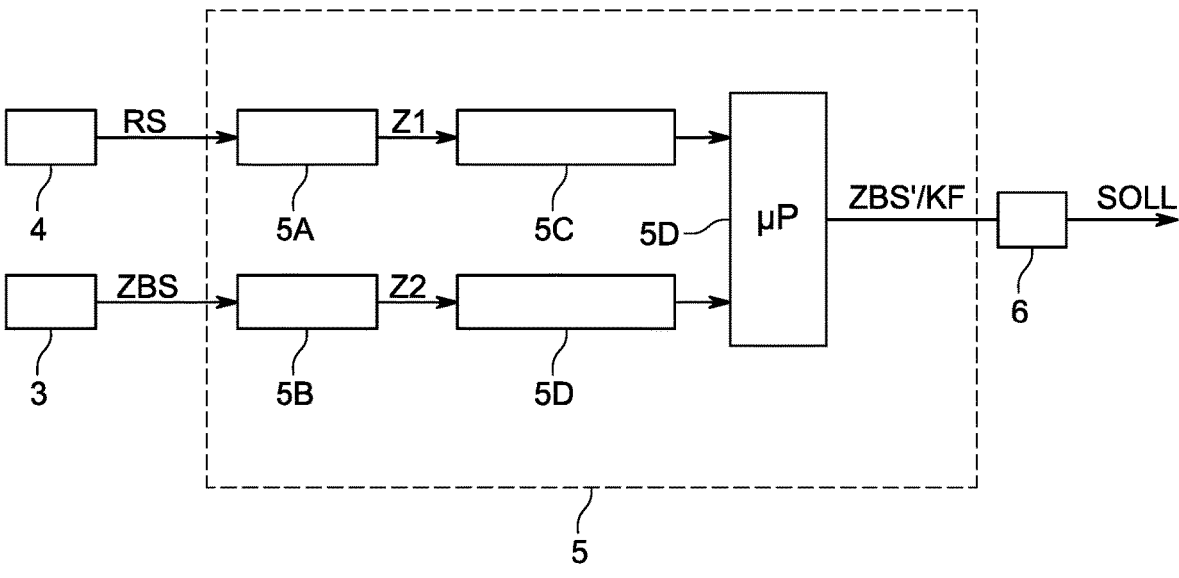

FIG. 2B shows an embodiment of a calibration unit 5 of the photovoltaic inverter 1. The calibration unit 5 has two digital counters 5A, 5B. The first counter 5A is clocked by the received reference signal RS, for example a radio signal DCF 77, which has a frequency of 77.5 kHZ. The second counter 5B is clocked by the local time base signal ZBS generated by the local time signal generator 3, for example having a relatively high clock frequency of 16 MHz. The counter values 21, 22 of the two counters 5A, 5B are temporarily stored in associated registers or temporary memories 5C, 5D. The counters 5A, 5B are, for example, 32-bit counters or 64-bit counters. A computing unit, in particular a microprocessor 5D, determines a difference of the counter values 21, 22 of the two counters 5A, 5B stored temporarily in the registers 50, 5D and calculates a correction factor KF depending on the deviation and/or corrects the time base signal ZBS depending on the determined deviation. The corrected time base signal ZBS' or the correction factor KF are provided by the calibration unit 5 to the control unit 6 connected thereto for adaptation of the nominal values or nominal values (SOLL), which the control unit 6 applies to the regulating unit 2D of the conversion circuit 2.

The calibration unit 5 also allows photovoltaic inverters 1, which are already installed on a user's site and which only have an outdated oscillator or time signal generator 3 with only a relatively inaccurate time base signal ZBS, to continue to operate and to increase their frequency measurement accuracy with the help of the received reference signal RS without replacement of the (outdated) time base signal generator 3 installed in the photovoltaic inverter 1. Thus, one has an upgrade possibility by software adaptation without having to adapt or replace installed hardware.

In a possible embodiment, the determined deviations between the reference signal RS received by the receiving unit 4 and the time base signal ZBS obtained by the time signal generator 3 can be stored in the data storage 7 of the calibration unit 5 together with at least one operating parameter BP of the photovoltaic inverter 1. In a possible embodiment, the operating parameter BP is an internal temperature T prevailing inside the housing of the photovoltaic inverter 1. This temperature T can, for example, be continuously measured by a temperature sensor 9 of the photovoltaic inverter 1. The temperature sensor 9 transmits the measured operating parameter BP or the internal temperature T to the control unit 6, which stores the operating parameter BP together with the obtained time base signal ZBS as a data record in the data storage 7. Alternatively, the operating parameter also comprise a measured supply voltage. The calibration unit 5 of the photovoltaic inverter 1 then preferably corrects the time base signal ZBS received from the time signal generator 3 additionally depending on at least one further operating parameter BP stored in the data storage 7 of the calibration unit 5. For example, even if the reference signal RS is temporarily unavailable, a correction is made depending on the measured internal temperature $T_{innen}$, which is measured by the temperature sensor 9 of the photovoltaic inverter 1.

The conversion circuit 2 receives the direct current from the photovoltaic array and, in one possible embodiment, feeds the converted alternating current into a power supply grid SVN via a controllable grid disconnection device 10. The generated AC power can additionally be used to supply local electrical power consumption units. In another possible embodiment, the photovoltaic inverter 1 also has at least one measuring unit which determines a current grid frequency f of the power supply grid SVN on the basis of the time base signal ZBS' corrected by the calibration unit 5. The grid frequency f of the power supply grid SVN is, for example, 50 or 60 Hz. Fluctuations in the grid frequency can be accurately determined by the measurement unit of the photovoltaic inverter 1 based on the corrected time base signal ZBS'. Based on the measurement made, the feed-in of the AC power generated can be controlled more accurately by the control unit 6. For example, if the grid frequency f of the power supply grid SVN rises above a limit value, the generated AC current should or must be reduced to stabilize the grid frequency f of the power supply grid SVN. If, for example, the grid frequency f of the power supply grid SVN falls below a limit value, the generated AC current should or must be increased in order to stabilize the grid frequency f of the power supply grid SVN.

However, in the event of inadmissible or major frequency changes, the current feed-in must be stopped. In this case, the grid disconnection device 10 is opened and disconnects the photovoltaic inverter or the inverter 1 from the power supply grid SVN.

In case of only minor frequency changes of the grid frequency f, i.e. in case of a change still within the limit values, the fed-in AC current can be adapted. In this case, the grid disconnection device 10 has no effect and is not opened.

In one possible embodiment, the time signal generator 3 has a quartz, resonator or oscillator that generates an oscillating time base signal ZBS and transmits it to the calibration unit 5 of the photovoltaic inverter 1. The time signal generator 3 generates a periodic or oscillating time signal. For this purpose, the time signal generator 3 has a circuit that generates electrical voltage with a characterizing time characteristic. The circuit may, for example, include an oscillating quartz which is provided for generating electrical oscillations with a specific frequency. For this purpose, the oscillating quartz is fit with electrodes on both sides, to which an alternating field generated by any oscillator is applied. As a result, the frequency of the alternating field can be brought into line with the natural mechanical frequency of the oscillating crystal. This allows the oscillating quartz to vibrate or oscillate like an electrical resonant circuit with very low damping. However, the electronic components of the time base signal generator 3 are subject to aging over time, which in the photovoltaic inverter 1 according to the invention is compensated or corrected by means of the received reference signal RS. The time base signal generator 3 may also comprise other circuits, for example a PLL circuit for generating a time base signal ZBS.

Figures 3, 4:
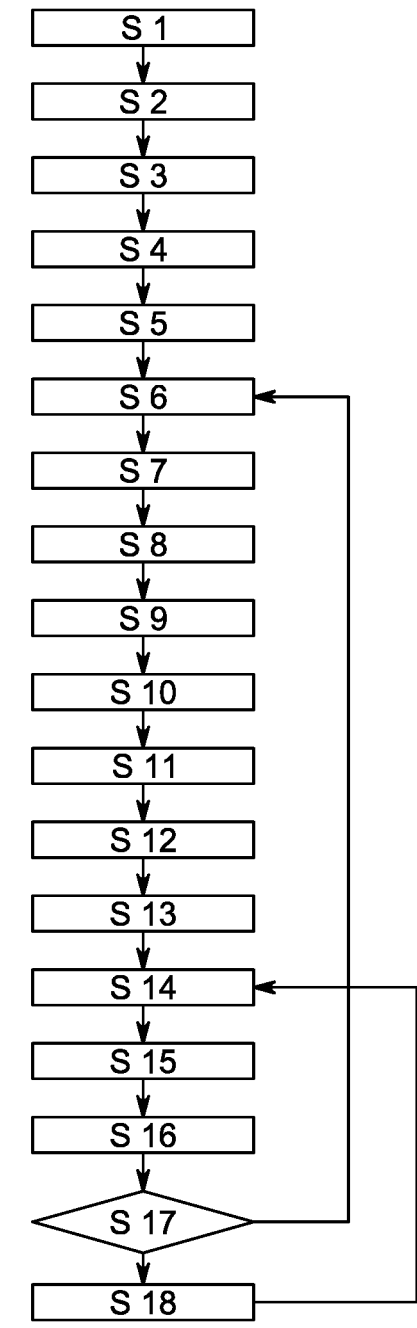
FIG. 3 a flowchart explaining an embodiment of a method according to the invention for calibrating a time base signal in a photovoltaic inverter.
FIG. 4 a flowchart illustrating a possible exemplary implementation of a process according to the invention.

FIG. 3 shows a flowchart of a possible embodiment of the method according to the invention for calibrating a time base signal ZBS in a photovoltaic inverter 1.

In the embodiment shown in FIG. 3, the process according to the invention essentially comprises four main steps S-A to S-D.

In a first step S-A, a reference signal RS is received by a receiving unit 4 of the photovoltaic inverter 1 from an external reference signal source RSQ. In one possible embodiment, the reference signal RS is a radio reference signal. The reference signal RS may serve as a clock signal CLK for a first counter 5A, as also shown in FIG. 2B.

Then, in a further step S-B, a deviation between the received reference signal RS and the current time base signal ZBS generated by the time signal generator 3 of the photovoltaic inverter 1 is determined. The locally generated time base signal ZBS can be supplied as a clock signal CLK to a second counter 5B. The temporarily stored counter readings Z1, 22 of the two counters 5A, 5B are compared with each other to determine the deviation or difference. In one possible variant, the determination of the deviation or difference can be performed automatically on a continuous basis. Alternatively, the deviation is determined at regular predetermined time intervals.

In a further step S-C, the generated time base signal ZBS is automatically adjusted to minimize the determined deviation (s) and thus corrected. Alternatively, a correction factor KF can also be calculated. The calculation of the correction factor KF is performed, for example, by a microprocessor 5D on the basis of counter values 21, 22 of the two counters 5A, 5B temporarily stored in registers 5C, 5D.

Subsequently, in a step S-D, the nominal values or set point values (SOLL) for a regulation of the electric currents I and/or electric power P are adjusted depending on the corrected time base signal ZBS' or the calculated correction factor KF. Control signals or the regulating signals CRTL for components or stages 2A, 2C of the conversion circuit 2 of the photovoltaic inverter 1 are generated by a regulation 2D according to the adjusted nominal values or set point values (SOLL).

Furthermore, the corrected time base signal ZBS' can also form the basis for measurements which, for example, determine a current grid frequency f of the power supply grid SVN. In this way, the grid frequency f of the power supply grid SVN can be determined with a higher accuracy or temporal resolution and critical states of the power supply grid SVN with regard to its network frequency f can be detected more correctly or more precisely. Consequently, countermeasures to achieve higher network stability can also be controlled more precisely on the part of the control unit 6. The amplitude of the fed-in alternating current and thus the fed-in electrical power P can be adjusted, if necessary, on the basis of the grid frequency f of the power supply grid SVN, which is precisely measured with the aid of the corrected time base signal ZBS'. This adjustment can be made as long as the grid frequency f deviates only slightly from a nominal grid frequency and is still within a limit value range. If the measured grid frequency f deviates more strongly from the nominal grid frequency, the grid disconnection device 10 is automatically opened by the control unit 6 of the photovoltaic inverter 1.

The photovoltaic inverter 1 will continuously feed the AC current it generates into the power supply grid SVN at the current grid voltage frequency f just measured, provided that the grid disconnection device 10 is closed.

Compared to conventional photovoltaic inverters, the photovoltaic inverter 1 according to the invention exhibits a higher performance or efficiency with regard to the performed feeding of alternating current into the power supply grid SVN, since the feeding can be performed on the basis of a more precise measurement in terms of time. Furthermore, the photovoltaic inverter 1 according to the invention exhibits a longer operating life, since aging processes of electronic components, in particular electronic components of the conversion circuit 2, are continuously compensated.

FIG. 4 shows a flowchart illustrating an embodiment for explaining a possible implementation of the method according to the invention for calibrating a time base signal ZBS in a photovoltaic inverter 1.

In a first step S1, a counter n is set to an initial value 0 ((n)=0). In a further step S2, either the time is determined or queried directly or the counter reading Z of a reference signal counter, i.e. the reference signal RS, for example of the counter 5A shown in FIG. 2B, is read out and stored in a corresponding data storage or register, for example in the register 5C shown in FIG. 2B.

In a further step S3, the counter reading of a further counter clocked by the time signal generator 3 is read out and stored. For example, the counter reading Z2—i.e. the time base signal ZBS—of the counter 5B in FIG. 2B is read out in step S3 and temporarily stored in register 5D.

In a further step S4, a new waiting time until the next measuring time point can be defined and temporarily stored.

In the subsequent step S5, the system waits until this newly defined measuring time point.

Subsequently, in step S6, the counter n initialized in step S1 is incremented ((n)=(n)+1). In a step S7, the time is determined again or the counter reading Z1—i.e. the reference signal RS—of the reference signal counter, i.e. counter 5A, is read out and stored in the associated register 5C.

Thereupon, in step S8, the counter reading Z2 of the counter 5B clocked by the time base signal ZBS is read out and the read-out counter reading Z2 is temporarily stored in the associated register 5D.

In a further step S9, the difference between the counter readings Z1, Z2 of the two counters 5A, 5B from the last measuring time point n−1 is determined by the computing unit or processor 5D.

$$DeltaZBS(n) = ZBS(n) - ZBS(n-1)$$

$$DeltaRS(n) = RS(n) - RS(n-1)$$

In a further step S10 a determination of the past time differences to the last measuring time point (n−1) is performed.

$$DeltaTimeZBS(n) = DeltaZBS(n)/FrequencyZBS$$

DeltaTimeRS (n)=DeltaRS (n)/FrequencyRS, where FrequencyZBS is the local frequency rate of the time base signal ZBS and where the time of FrequencyRS is the frequency of the reference signal RS.

$$DeltaTimeRS(n) = RS(n) - RS(n-1)$$

This formula is to be used if the reference signal has no frequency, such as in variant B.

Thus, in steps S9 and S10, the deviation or a time deviation is determined which is required for the following correction (S-C) of the time base signal (ZBS) to minimize the determined deviation or for the calculation of a correction factor (KF).

In a further step S11, a determination of a relative error of the local oscillator or the local time signal generator 3 is performed. Thus, the corrected time base signal ZBS' or the correction factor KF is determined or calculated as follows:

$$ErrorZBS(n) = DeltaTimeZBS(n)/DeltaTimeRS(n)$$

In a further step S12, a determination of the ambient conditions AmbientLoc (n) of the local timing signal generator 3 can optionally be performed. For example, the local temperature T or a local supply voltage are determined.

In a further step S13, the determined relative error of the local time signal generator 3 ErrorZBS (n) is optionally stored in a one- or multi-dimensional field or data array in a data storage depending on the ambient conditions AmbientLoc (n) determined in step S12. Alternatively, an improved parameter for a fit formula can be calculated in step S13, which describes the error depending on the determined ambient conditions, for example a temperature dependence of oscillating quartzes.

In a further step S14, the relative error of the local time signal generator 3 ErrorZBS (n) is provided for the correction of time-varying values, parameters and/or settings.

Likewise, corrections are carried out and/or a calculation routine is triggered.

In a further step S15 a new waiting time until a next measuring time point can be defined.

In the subsequent step S16, the system waits until this new measuring time point.

In step S17, it is determined whether a reference signal source RSQ is available or whether a reference signal RS is received by the receiving unit 4. If this is the case, the process returns to step S6, as can be seen in the flow diagram according to FIG. 4. Conversely, if no reference signal source RSQ is available, the determination of a new error based on the ambient conditions and based on the information stored in the one-dimensional or multi-dimensional data field is performed in step S18. Alternatively, the calculation of an error based on the fit formula can be performed. The process then returns to step S14, as shown in FIG. 4.

In general, the determined error consists of the looked—for error of the local oscillator 3, an error of the reference signal source RSQ and an error which occurs during the determination of the reference. This last-mentioned error is absolute and can be, for example, about 10 msec for queried Internet time. The error of the reference signal source RSQ is typically very low and therefore often negligible. For example, for a DCF 77 radio signal source, the frequency error over 24 hours is $2^{-12}$. The waiting time will be chosen large enough to obtain a relatively small error from the absolute error so that it can then be neglected.

FIG. 5A to FIG. 5E, described below, are aligned in time and show the main steps according to FIG. 4.

FIG. 5A shows an example of different values in a corresponding sequence or executed program according to FIG. 4. As shown, the time signal generator 3 supplies, for example, a time base signal ZBS with a frequency of 16 MHz. This time base signal ZBS is applied by the local oscillator or the time signal generator 3 as a clock signal to the counter 5B for counting the pulses. The different values show the count values Z2 of the counter 5B. For example, counting starts with count value 1. At count value 206, approximately 13 us has passed, and at count value 57,600,000,000, one hour would have passed if the clock signal is accurate or has no deviations. However, if the clock signal is inaccurate or has deviations, there will be, for example, a count value of 57,602,304,000 after one hour as shown in FIG. 5A.

The following FIG. 5B and FIG. 5C show two variants VarA, VarB for determining a reference time.

In the first variant VarA shown in FIG. 5B, a reference radio signal RS is received by the receiving unit 4 from a radio signal source DCF 77 with a clock frequency of 77.5 KHz, and a corresponding counter 5A counts the pulses of the received reference signal RS. At the time when the counter 5B starts with the count value 1, the counter 5A has a value of 573 in the example shown. After about 13 μs, the count value of the counter 5A increases by the value 1 to the value 574. After one hour, the value 279,000,573 is then reached, as shown in FIG. 5B.

Due to the different frequencies of the reference signal RS and the time base signal ZBS, the duration of the pulses is also different—as shown.

Alternatively, according to the second variant VarB shown in FIG. 5C, the reference time can be determined directly, e.g. by an internet query and then converted into absolute milliseconds, as also shown in FIG. 5C. Here, no pulses or no counters are used, but the query is made on demand.

The waiting time between two measurements can be, for example, 3,600 see, i.e. one hour. However, it can be selected individually accordingly.

FIG. 5D shows an example of correspondingly determined values at two measuring time points, which are separated by a waiting time of 3,600 sec. Variant VarA (FIG.

5B) is selected here as the reference signal RS (see the values in the left box of FIG. 5D).

The measuring time points are synchronized accordingly to the waiting time, whereby the waiting time is monitored by the reference signal RS, for example. This means that both the value of the reference signal RS and the value of the time base signal ZBS are read out or queried when the waiting time expires.

These current values are used accordingly to calculate the correction factor KF.

The first measurement instant, i.e. n=0, is at the second pulse of the ZBS, hence ZBS=2. At this instant, the counter 5A has a value of 573, where this corresponds to the value for the reference signal RS.

The second measuring time point, i.e. n=1, is at the pulse with the counter value 57,602,304,002 (=ZBS) after the waiting time of one hour. The reference signal RS has correspondingly the value one hour later, i.e. RS=279,000,573.

The other values in the box on the right in FIG. 5D show:
DeltaRS=279,000,573 minus 573=279,000,000
   DeltaZBS=57,602,304,002 minus 2=57,602,304,000
   DeltaTimeRS=279.000.000/77.5 kHz=3600 sec
   DeltaTimeZBS=57.602.304.000/16 MHz=3600,144 sec
   ErrorZBS=3600,144/3600=1,00004=Correction factor KF FIG. 5E shows an example of correspondingly determined values at two measuring time points, which are 3, 600 sec. apart according to the waiting time. Variant VarB (FIG. 5C) is selected here as RS (see the values in the left box of FIG. 5E).

The measuring time points are synchronized accordingly to the waiting time, whereby the waiting time is monitored by the reference signal RS, for example. This means that both the value of the reference signal RS and the value of the time base signal ZBS are read out or queried when the waiting time ends. These current values are used accordingly to calculate the correction factor KF.

The first measuring time point, i.e. n=0, is at the second pulse of the ZBS, therefore ZBS=2. At this time, the reference signal RS is also queried from the Internet (variant VarB) and results in a value of 18,000,000 ms (=RS) in the example shown—i.e. five hours after midnight/5 o'clock.

The second measuring time point, i.e. n=1, is at the pulse with the counter value 57,602,304,002 (=ZBS) after the waiting time of one hour. The reference signal RS has correspondingly the value one hour later (i.e. 6 o'clock/6 a.m.), thus RS=21, 600,000 ms.

The other values in the box on the right in FIG. 5E show:
DeltaRS=21,600,000 ms minus 18,000,000 ms=3,600,000 ms
   DeltaZBS=57,602,304,002 minus 2=57,602,304,000
   DeltaTimeRS=DeltaRS
   DeltaTimeZBS=57,602,304,000/16 MHz=3600.144 sec
   ErrorZBS=3600.144 sec/3600 sec=1.00004=correction factor KF In summary, for FIG. 5D and FIG. 5E:

Thus, starting from the second measuring time point, a correction factor KF can be determined with respect to the previous measuring time point.

Accordingly, the correction factor KF is independent of the reference used. As shown above on the basis of the example, both variant VarA (FIG. 5B, FIG. 5D) and variant VarB (FIG. 5C, FIG. 5E) result in an identical correction factor KF (in the example shown: KF=ErrorZBS (1)=1, 00004).

The correction factor KF can be stored both at the measuring time point and in relation to the ambient temperature T. The additional reference to a temperature, in particular ambient temperature, can be used, for example, if the reference signal RS is not available. Accordingly, the ambient temperature T is determined (see also steps S12 and S13 in FIG. 4).

In the example shown, the relative error is 0.144 sec per hour (3,600 sec). This relative error will be used as correction factor KF for the automatic correction of the time base signal ZBS and/or for the adjustment of the control nominal values (setpoint) (See also step S14 in FIG. 4).

The invention claimed is:

1. A method of calibrating a time base signal in a photovoltaic inverter having a conversion circuit with components for converting a direct current into an alternating current, comprising the following steps:
   receiving a reference signal by a receiving unit of the photovoltaic inverter from an external reference signal source;
   determining a deviation between the received reference signal and a time base signal generated by a local time signal generator of the photovoltaic inverter, wherein the time base signal is formed by a clock signal;
   correcting the time base signal to minimize the deviation or calculating a correction factor,
      wherein the time base signal generated by the time signal generator is automatically corrected depending on the reference signal in case the reference signal is available, and
      wherein the time base signal generated by the time signal generator is automatically corrected, in case the reference signal is temporarily unavailable, depending on at least one stored operating parameter, which is formed by a measured internal temperature inside the housing of the photovoltaic inverter and/or by a measured supply voltage; and
   adjusting nominal values for at least one component of the conversion circuit depending on the corrected time base signal or depending on the calculated correction factor.

2. The method according to claim 1, wherein the time base signal is automatically corrected continuously or at regular time intervals to minimize the detected deviation.

3. The method according to claim 1, wherein the determined deviations between the reference signal received by the receiving unit and the time base signal generated by the time signal generator and/or the calculated correction factor are stored together with at least the operating parameter of the photovoltaic inverter in a data storage of a calibration unit of the photovoltaic inverter.

4. The method according to claim 3, wherein the internal temperature inside the housing of the photovoltaic inverter is measured by a temperature sensor of the photovoltaic inverter.

5. A photovoltaic inverter comprising:
   a conversion circuit comprising electronic components which convert a direct current received into an alternating current;
   a time signal generator configured to generate a time base signal comprising a clock signal;
   a receiving unit provided for receiving a reference signal from an external reference signal source;
   a calibration unit which receives the time base signal from the time signal generator and which is configured and operable to automatically correct the time base signal on the basis of the reference signal received by the receiving unit, or calculates a correction factor, wherein the calibration unit automatically corrects the time base signal generated by the time signal generator depending on the reference signal in case the reference signal is available, and wherein the calibration unit automatically corrects the time base signal received from the time signal generator, in case the reference signal is temporarily unavailable, depending on at least one operating parameter stored in a data storage of the photovoltaic inverter, the at least one operating parameter being formed by an internal temperature inside the housing of the photovoltaic inverter and/or by a measured supply voltage; and a control unit configured and operable to adjust one or more nominal values for a regulating unit of the conversion circuit of the photovoltaic inverter depending on the corrected time base signal or the calculated correction factor.

6. The photovoltaic inverter according to claim 5, wherein the calibration unit of the photovoltaic inverter is further configured and operable to determine a deviation between the reference signal received by the receiving unit and the time base signal obtained from the time signal generator, and to automatically correct the obtained time base signal continuously or at regular time intervals to minimize the determined deviation.

7. The photovoltaic inverter according to claim 6, wherein the deviations determined by the calibration unit between the reference signal received by the receiving unit and the time base signal obtained from the time signal generator or the correction factor calculated by the calibration unit are stored in the data storage of the photovoltaic inverter.

8. The photovoltaic inverter according to claim 7, wherein the determined deviations between the reference signal received by the receiving unit and the time base signal obtained from the time signal generator and/or the calculated correction factor are stored together with the at least one operating parameter of the photovoltaic inverter in the data storage of the photovoltaic inverter.

9. The photovoltaic inverter according claim 5, wherein the photovoltaic inverter includes a measuring unit configured and operable to determine a current grid frequency of a power supply grid based on the time base signal corrected by the calibration unit.

10. The photovoltaic inverter according to claim 5, wherein the time signal generator comprises a quartz, resonator, or oscillator which generates an oscillating time base signal and transmits it to the calibration unit of the photovoltaic inverter.

11. The photovoltaic inverter according to claim 5, wherein the receiving unit of the photovoltaic inverter comprises a radio signal receiver receiving a radio reference signal from a radio signal source, or wherein the receiving unit of the photovoltaic inverter comprises a GPS receiver receiving a GPS reference signal from a GPS signal source, or wherein the receiving unit of the photovoltaic inverter receives a reference signal from a server via a data network.

12. The photovoltaic inverter according to claim 5, wherein nominal values of electric currents or of electric power for driving at least one electronic component or stage of the conversion circuit are continuously adjusted by the control unit of the photovoltaic inverter on the basis of the time base signal corrected by the calibration unit or on the basis of the correction factor calculated by the calibration unit.

13. A photovoltaic system comprising a photovoltaic array for generating a direct current which is converted by a photovoltaic inverter according to claim 5 into an alternating current for a power supply grid and/or for local power consumers.

* * * * *